(12) United States Patent
Breeuwer

(10) Patent No.: US 7,248,723 B2
(45) Date of Patent: *Jul. 24, 2007

(54) METHOD OF CORRECTING INHOMOGENEITIES/DISCONTINUITIES IN MR PERFUSION IMAGES

(75) Inventor: Marcel Breeuwer, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 665 days.

This patent is subject to a terminal disclaimer.

(21) Appl. No.: 10/486,047

(22) PCT Filed: Jul. 31, 2002

(86) PCT No.: PCT/IB02/03236

§ 371 (c)(1),
(2), (4) Date: Feb. 6, 2004

(87) PCT Pub. No.: WO03/014760

PCT Pub. Date: Feb. 20, 2003

(65) Prior Publication Data

US 2004/0202358 A1      Oct. 14, 2004

(30) Foreign Application Priority Data

Aug. 9, 2001   (EP)   ................................. 01203028

(51) Int. Cl.
*G06K 9/00*   (2006.01)
(52) U.S. Cl. .................. 382/128; 382/294; 378/28
(58) Field of Classification Search ........ 382/128–133, 382/151, 169, 178, 194, 209, 274, 255–260, 382/278, 285, 294, 305; 600/410, 413, 425, 600/427, 437; 378/23, 28; 356/39; 250/453.11; 348/43, 46; 128/200.16
See application file for complete search history.

(56) References Cited

U.S. PATENT DOCUMENTS

| | | | | |
|---|---|---|---|---|
| 5,647,360 | A * | 7/1997 | Bani-Hashemi et al. ..... | 600/425 |
| 5,850,486 | A * | 12/1998 | Maas et al. .................. | 382/294 |
| 5,970,182 | A * | 10/1999 | Goris .......................... | 382/278 |
| 6,222,948 | B1 * | 4/2001 | Hossack et al. ............. | 382/294 |
| 6,292,683 | B1 * | 9/2001 | Gupta et al. ................ | 600/410 |
| 6,447,450 | B1 * | 9/2002 | Olstad ......................... | 600/437 |
| 6,501,979 | B1 * | 12/2002 | Manning et al. ............ | 600/413 |
| 7,024,024 | B1 * | 4/2006 | Aiazian ....................... | 382/128 |

OTHER PUBLICATIONS

Declerck et al: "Automatic Registration And Alignment On A Template Of Cardiac Stress And Rest Reoriented SPECT Images" IEEE Transactions On Medical Imaging, IEEE Inc., vol. 16, No. 6, Dec. 1, 1997, pp. 727-737.*

G Stalidis et al : "Parametric 4D Modeling of Myocardial Surface Motion Applied to MRI Data", Lab of Medical Information, Dept of Electrical Engng, AHEPA University Hodpital, Aristotle University, Thessaloniki, Greece 1997 IEEE Inc., pp. 319-322.*

* cited by examiner

*Primary Examiner*—Seyed Azarian

(57) ABSTRACT

The invention relates to a method of correcting inhomogeneities in MR perfusion images of the myocardium of a patient, which perfusion images relate time-sequentially to a preliminary phase which precedes the administration of a contrast medium and to an examination phase which succeeds the administration of the contrast medium, the perfusion images from the examination phase being corrected, in a correction step, for a detected intensity variation of the perfusion images from the preliminary phase, the perfusion images from the preliminary phase being transformed, prior to the correction step, in such a manner that pixels or groups of pixels thereof register with corresponding pixels or groups of pixels of the perfusion images from the examination phase.

5 Claims, No Drawings

METHOD OF CORRECTING INHOMOGENEITIES/DISCONTINUITIES IN MR PERFUSION IMAGES

BACKGROUND

The invention relates to a method of correcting inhomogeneities in MR perfusion images of the myocardium of a patient, which perfusion images relate time-sequentially to a preliminary phase which precedes the administration of a contrast medium and to an examination phase which succeeds the administration of the contrast medium, the perfusion images from the examination phase being corrected, in a correction step, for a detected intensity variation of the perfusion images from the preliminary phase.

MR perfusion images of the myocardium of a patient are formed so as to enable determination of the perfusion thereof. The actual image acquisition takes place after the injection of the contrast medium so as to enable suitable evaluation as to which parts, if any, of the myocardium exhibit insufficient perfusion.

From practice it is known to correct the perfusion images acquired after the administration of the contrast medium in the examination phase for the intensity variation detected in the preceding preliminary phase. This is because the acquired perfusion images exhibit an intensity variation which is dependent inter alia on the position occupied by the heart relative to the acquisition coils of the relevant MR scanner during the exposure. The intensity variation of the perfusion images from the preliminary phase preceding the administration of the contrast medium then serves as a starting point for the correction of the intensity variation of the perfusion images in the examination phase.

In practice, however, the above step often has an effect to the contrary, because the patient is allowed to inhale deeply a few times just before having to hold his or her breath during the administration of the contrast medium. Consequently, the position of the heart in the examination phase changes relative to the position occupied by the heart during the preliminary phase. The correction step executed in conformity with the state of the art, consequently, may give rise to incorrect correction of the intensity of the perfusion images from the examination phase.

It is an object of the invention to solve the latter problem.

SUMMARY

To this end, the method of correcting inhomogeneities in MR perfusion images in accordance with the invention is characterized in that, prior to the correction step, the perfusion images from the preliminary phase are transformed in such a manner that pixels or groups of pixels thereof register with corresponding pixels or groups of pixels, that is, pixels or groups of pixels relating to the same position in the heart of the patient, of the perfusion images from the examination phase. The correction step can thus be related each time to the correct pixels or groups of pixels.

In conformity with a first version of the method in accordance with the invention, the correction step is preferably carried out for each pixel separately. This results in a comparatively accurate correction of the brightness of the various pixels constituting the perfusion images.

When the number of operations and the calculation time required for these operations must be controlled so as to enable fast transformation, in conformity with a second preferred version of the method of the invention the correction step is preferably carried out each time for a group of pixels, which group is selected from the set formed by:
  a series of pixels situated on one or more contours within the myocardium,
  the pixels situated each time within a segment of the myocardium,
  the pixels situated each time within a part of a segment of the myocardium.

DESCRIPTION

The invention will be described in detail hereinafter with reference to an embodiment which, however, does not limit the appended claims in any way whatsoever.

During a first step of the method there is determined a transformation which relates the perfusion images from the preliminary phase, in which no contrast medium has been administered to the patient yet, to the perfusion images from the examination phase which succeeds the administration of the contrast medium.

Various methods can be used to carry out such a transformation. A method of this kind is described, for example, in the article "Validation of Non-Rigid Registration using Finite Elements Methods" by J. Schnabel et al. which is to be presented during the IPMI 2001.

The next step may be the determination of the intensity variation of the perfusion images from the preliminary phase by averaging this intensity in different positions or in different segments of the myocardium. Without intent to exclude any other methods, in this respect the following methods may be mentioned by way of example:
  an intensity determination for each pixel in the myocardium separately,
  an intensity determination for all pixels situated on one or more contours within the myocardium;
  an intensity determination which is valid each time for a segment of the myocardium;
  an intensity determination each time for a part of a segment of the myocardium.

During the subsequent correction step, an intensity correction is carried out for each pixel or each group of pixels of the perfusion images from the examination phase, which intensity correction corresponds to the intensity variation in the corresponding pixels or groups of pixels of the perfusion images from the preliminary phase. Thus, for each pixel or group of pixels a relative brightness variation is measured so as to enable more accurate diagnosis of the perfusion of the myocardium.

The invention also relates to a workstation for correcting inhomogeneities in MR perfusion images of the myocardium of a patient, which perfusion images relate time-sequentially to a preliminary phase which precedes the administration of a contrast medium and to an examination phase which succeeds the administration of the contrast medium, the perfusion images from the examination phase being corrected, in a correction step, for a detected intensity variation of the perfusion images from the preliminary phase, characterized in that, prior to the correction step, the perfusion images from the preliminary phase are transformed in such a manner that pixels or groups of pixels thereof register with corresponding pixels or groups of pixels of the perfusion images from the examination phase. The workstation of the invention is in particular suitable for carrying out the method of the invention. The workstation, for example, comprises circuitry that is designed to carry out the steps of the method of the invention. The invention also relates to a computer program for correcting inhomogeneities in MR perfusion images of the myocardium of a patient, which perfusion images relate time-sequentially to a preliminary phase which precedes the administration of a contrast medium and to an examination phase which succeeds the administration of the contrast medium, which computer program includes instructions whereby the perfusion images from the examination zone are corrected, in a correction step, for a detected intensity variation of the perfusion images from the preliminary phase, characterized in that the computer program also includes instructions for transforming, prior to the correction step, the perfusion images from the preliminary phase in such a manner that pixels or groups of pixels thereof register with corresponding pixels or groups of pixels of the perfusion images from the examination phase. The computer program of the invention can be loaded into the working memory of a workstation so as to suitably program the workstation to allow the workstation to carry out the method of the invention. The computer program of the invention may be stored on a data carrier such as a CD-ROM or may be downloaded from a data network such as the world-wide web.

The invention claimed is:

1. A method of correcting inhomogeneities in MR perfusion images of the myocardium of a patient, which perfusion images relate time-sequentially to a preliminary phase which precedes the administration of a contrast medium and to an examination phase which succeeds the administration of the contrast medium, the perfusion images from the examination phase being corrected, in a correction step, for a detected intensity variation of the perfusion images from the preliminary phase, characterized in that, prior to the correction step, the perfusion images from the preliminary phase are transformed in such a manner that pixels or groups of pixels thereof register with corresponding pixels or groups of pixels of the perfusion images from the examination phase.

2. A method as claimed in claim 1, characterized in that the correction step is carried out for each pixel separately.

3. A method as claimed in claim 1, characterized in that the correction step is carded out each time for a group of pixels, which group is selected from the set formed by: a series of pixels situated on one or more contours within the myocardium, the pixels situated each time within a segment of the myocardium, the pixels situated each time within a part of a segment of the myocardium.

4. A workstation for correcting inhomogeneities in MR perfusion images of the myocardium of a patient, which perfusion images relate time-sequentially to a preliminary phase which precedes the administration of a contrast medium and to an examination phase which succeeds the administration of the contrast medium, the perfusion images from the examination phase being corrected, in a correction step, for a detected intensity variation of the perfusion images from the preliminary phase, characterized in that, prior to the correction step, the perfusion images from the preliminary phase are transformed in such a manner that pixels or groups of pixels thereof register with corresponding pixels or groups of pixels of the perfusion images from the examination phase.

5. A working memory, in a working station, storing a computer program therein, for correcting inhomogeneities in MR perfusion images of the myocardium of a patient, which perfusion images relate time-sequentially to a preliminary phase which precedes the administration of a contrast medium and to an examination phase which succeeds the administration of the contrast medium, which computer program includes instructions whereby the perfusion images from the examination zone arc corrected, in a correction step, for a detected intensity variation of the perfusion images from the preliminary phase, characterized in that the computer program also includes instructions for transforming, prior to the correction step, the perfusion images from the preliminary phase in such a manner that pixels or groups of pixels thereof register with corresponding pixels or groups of pixels of the perfusion images from the examination phase.

* * * * *